United States Patent
Kim et al.

(10) Patent No.: US 7,572,568 B2
(45) Date of Patent: *Aug. 11, 2009

(54) DONOR SUBSTRATE FOR LASER INDUCED THERMAL IMAGING AND METHOD OF FABRICATING ORGANIC LIGHT EMITTING DISPLAY USING THE SAME SUBSTRATE

(75) Inventors: Mu-Hyun Kim, Suwon-si (KR); Myung-Won Song, Suwon-si (KR); Byung-Doo Chin, Suwon-si (KR); Seong-Taek Lee, Suwon-si (KR)

(73) Assignee: Samsung SDI Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/874,163

(22) Filed: Oct. 17, 2007

(65) Prior Publication Data

US 2008/0038680 A1 Feb. 14, 2008

Related U.S. Application Data

(63) Continuation of application No. 11/212,024, filed on Aug. 24, 2005, now Pat. No. 7,294,444.

(30) Foreign Application Priority Data

Aug. 30, 2004 (KR) .................. 10-2004-0068774

(51) Int. Cl.
*G03F 7/34* (2006.01)
*G03F 7/00* (2006.01)

(52) U.S. Cl. ............... 430/200; 430/201; 430/270.1; 156/540

(58) Field of Classification Search .............. None
See application file for complete search history.

(56) References Cited

U.S. PATENT DOCUMENTS

| | | | |
|---|---|---|---|
| 5,998,085 | A | 12/1999 | Isberg et al. |
| 6,114,085 | A | 9/2000 | Padmanaban et al. |

(Continued)

FOREIGN PATENT DOCUMENTS

CN 1236289 A 11/1999

(Continued)

OTHER PUBLICATIONS

China Office action dated Apr. 4, 2008, for corresponding Chinese application 2005100938018, indicating relevance of the listed CN 1236289 reference in this IDS.

(Continued)

*Primary Examiner*—Amanda C. Walke
(74) *Attorney, Agent, or Firm*—Christie, Parker & Hale, LLP

(57) ABSTRACT

A donor substrate for laser induced thermal imaging (LITI) and a method of fabricating an organic light emitting display (OLED) using the donor substrate are provided. A conductive frame is disposed on and connected to an anti-static layer of the donor substrate and frames the periphery of the donor substrate. The conductive frame is connected to a grounded stage. An organic layer is formed using LITI, and the generation of static electricity is controlled.

21 Claims, 5 Drawing Sheets

U.S. PATENT DOCUMENTS

| | | | |
|---|---|---|---|
| 6,194,119 B1 * | 2/2001 | Wolk et al. | 430/200 |
| 6,214,520 B1 | 4/2001 | Wolk et al. | |
| 6,221,543 B1 | 4/2001 | Guehler et al. | |
| 6,410,201 B2 | 6/2002 | Wolk et al. | |
| 7,108,949 B2 | 9/2006 | Kim et al. | |
| 2003/0008224 A1 | 1/2003 | Fujita et al. | |
| 2003/0068525 A1 * | 4/2003 | Bellmann et al. | 428/690 |

FOREIGN PATENT DOCUMENTS

| | | |
|---|---|---|
| CN | 1361880 A | 7/2002 |
| EP | 0 948 063 A2 | 10/1999 |
| EP | 1 329 955 A3 | 6/2006 |
| JP | 2003-063140 | 3/2003 |
| JP | 2003-243167 | 8/2003 |
| JP | 2004-158436 | 6/2004 |
| KR | 2002-0016128 | 3/2002 |
| WO | WO 00/41894 | 7/2000 |

OTHER PUBLICATIONS

Extended European Search Report dated Jun. 20, 2006 for European 05107902.8, in the name of Samsung SDI Co., Ltd.

Korean Patent Abstracts, Publication No. 1020020016128 A, dated Mar. 4, 2002, in the name of Tae Min Kang.

Chinese Patent Registration Gazette dated Mar. 25, 2009, for corresponding Chinese application 200510093801.8, noting listed references in this IDS.

* cited by examiner

DONOR SUBSTRATE FOR LASER INDUCED THERMAL IMAGING AND METHOD OF FABRICATING ORGANIC LIGHT EMITTING DISPLAY USING THE SAME SUBSTRATE

CROSS-REFERENCE TO RELATED APPLICATION(S)

This application is a continuation of U.S. patent application Ser. No. 11/212,024 filed Aug. 24, 2005, which claims priority to and the benefit of Korean Patent Application No. 2004-68774 filed on Aug. 30, 2004, the disclosures of which are fully incorporated herein by this reference.

FIELD OF THE INVENTION

The present invention relates to a donor substrate for laser induced thermal imaging (LITI) and a method of fabricating an organic light emitting display (OLED) using the same substrate. More particularly, the invention is directed to a donor substrate for LITI and a method of fabricating an OLED using the same substrate capable of controlling the generation of static electricity.

BACKGROUND OF THE INVENTION

Recently, OLEDs have become appropriate mediums for displaying high-resolution moving images because they consume little power and have high luminous efficiency, wide viewing angles, and fast response speeds. For these reasons, OLEDs have attracted much attention as next-generation displays.

A typical OLED includes an organic emission layer positioned between an anode and a cathode. The OLED is a self-emissive display in which voltage is applied between the anode and the cathode, causing electrons to recombine with holes in the organic emission layer, thereby generating light. Since the OLED does not require a backlight such as a liquid crystal display (LCD), it may be lightweight and thin and fabricated by a simple process.

OLEDs may be classified into small molecular OLEDs and polymer OLEDs according to the material of the organic emission layer.

A small molecular OLED includes a multilayered organic layer having different functions. For example, the organic layer may include a hole injection layer, a hole transport layer, an emission layer, a hole blocking layer, and an electron injection layer, each positioned between an anode and a cathode. To prevent accumulation of charges, the organic layer may be doped or may comprise a material having an appropriate energy level. However, these organic layers are typically formed by vacuum deposition, making it difficult to fabricate larger displays.

A polymer OLED can include either a single organic emission layer or a double-layered structure including an organic emission layer and a hole transport layer. Thus, polymer OLEDs may be fabricated with smaller thicknesses. Also, because the organic layer is formed by wet coating, it may be formed under normal pressure, thereby greatly reducing production cost and enabling easy manufacture of larger OLEDs.

Polymer OLEDs are easily fabricated by spin coating, but are inferior in efficiency and lifetime than small molecular OLEDs. Also, full-color devices may be fabricated by patterning red (R), green (G), and blue (B) emission layers on OLEDs. An organic layer of a small molecular OLED may be patterned by deposition using a shadow mask. An organic layer of a polymer OLED may be patterned by inkjet printing or laser induced thermal imaging (LITI). Since LITI uses spin coating features, larger organic layers are formed and pixel uniformity may be improved. Also, because LITI is a dry process, reduction in the lifetime of the OLED that can occur with solvents is prevented and the organic layer may be finely patterned.

LITI basically requires a light source, an OLED substrate and a donor substrate. The donor substrate includes a base layer, a light-to-heat conversion (LTHC) layer and a transfer layer.

During LITI, light is emitted from the light source and absorbed in the LTHC layer, thus converting the light into thermal energy and forming an organic material on the transfer layer which may be transferred onto the substrate by the thermal energy.

Methods of patterning an organic layer on an OLED using LITI are disclosed in Korean Patent Registration No. 10-0342653 and U.S. Pat. Nos. 5,998,085, 6,214,520 and 6,114,085.

FIGS. 1A through 1C are cross-sectional views of a prior art method of patterning an organic layer 23 using LITI.

As shown in FIG. 1A, a substrate 10 and a donor substrate 20 including a base layer 21 are provided. An LTHC layer 22 and an organic layer 23 are laminated on the substrate 10.

As shown in FIG. 1B, laser beams are irradiated onto the base layer 21 of the donor substrate 20 in a first region a. The laser beams are transmitted through the base layer 21 and converted into heat in the LTHC layer 22. The heat weakens the adhesion of the organic layer 23 with the LTHC layer in the first region a.

As shown in FIG. 1C, after the organic layer 23 in the first region a is transferred to the substrate 10, the donor substrate 20 is detached from the substrate 10. Thus, an organic transfer layer 23a is patterned on the substrate 10, and an organic layer 23b in a second region b is detached from the substrate 10 along with the donor substrate 20, thereby completing the organic transfer pattern 23a. The second region b is the region to which no laser beams are irradiated.

However, in forming the organic transfer layer 23a by LITI, static electricity may be generated from rubbing and other external environmental factors that may occur during the attachment/detachment of the donor substrate 20 to/from the substrate 10. Since voltage can reach several thousands to several tens of thousands during discharge, the static electricity may cause a short circuit at a junction of the OLED, the metal layer may melt due to a rise in the temperature of the OLED, or a junction line may open. If such failures occur in the OLED, the internal circuit of the OLED may be adversely affected, thereby deteriorating the properties of the OLED.

SUMMARY OF THE INVENTION

In one embodiment of the present invention, a method of fabricating an organic light emitting display (OLED) enables control of the generation of static electricity that can occur when an organic layer is formed by laser induced thermal imaging (LITI).

In one exemplary embodiment of the present invention, a donor substrate for LITI includes: a base layer; a light-to-heat conversion (LTHC) layer disposed on the surface of the base layer; an anti-static layer disposed on the surface of the LTHC layer; a transfer layer disposed on the surface of the anti-static layer; and a conductive frame connected to the anti-static layer and framing the periphery of the donor substrate.

In another exemplary embodiment of the present invention, a method of fabricating a donor substrate for use in LITI includes: providing a base layer; forming an LTHC layer on the surface of the base layer; forming an anti-static layer on the surface of the LTHC layer; forming a transfer layer on the anti-static layer; and forming a conductive frame on a periphery of the resultant donor substrate. The anti-static layer is connected to the frame.

In still another exemplary embodiment of the present invention, a method of fabricating an OLED includes: patterning a first electrode on a substrate; fixedly adsorbing the substrate to a stage that is transferable and grounded; positioning the framed donor substrate opposite a pixel region of the substrate; transferring an organic layer including at least an emission layer to the donor substrate by selectively irradiating laser beams on the donor substrate; detaching the donor substrate from the substrate; and forming a second electrode on the surface of the substrate which includes the organic layer.

In yet another exemplary embodiment of the present invention, an OLED is fabricated according to the above-described method.

BRIEF DESCRIPTION OF THE DRAWINGS

The above and other advantages of the present invention will become more apparent by reference to the following detailed description when considered in conjunction with the accompanying drawings, in which.

DETAILED DESCRIPTION OF THE INVENTION

The present invention will now be described with reference to the accompanying drawings.

Figure 1A:
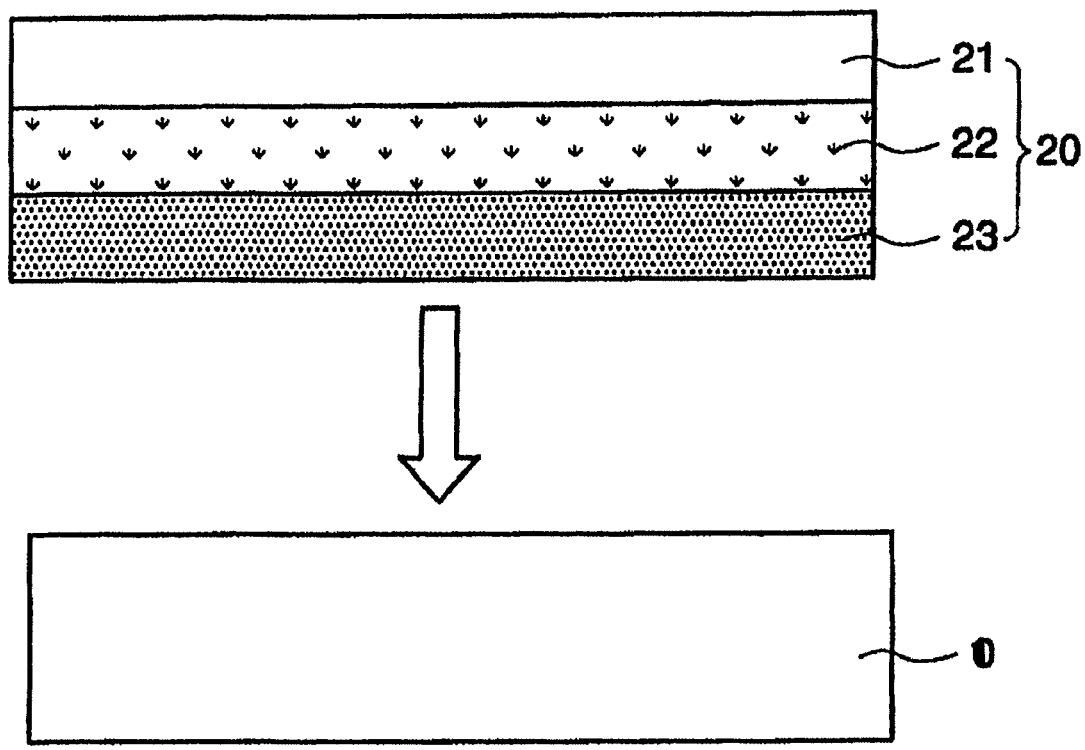
FIG. 1A is a cross-sectional view of a substrate and donor substrate illustrating a first step in a prior art process for patterning an organic layer.
Figure 1B:
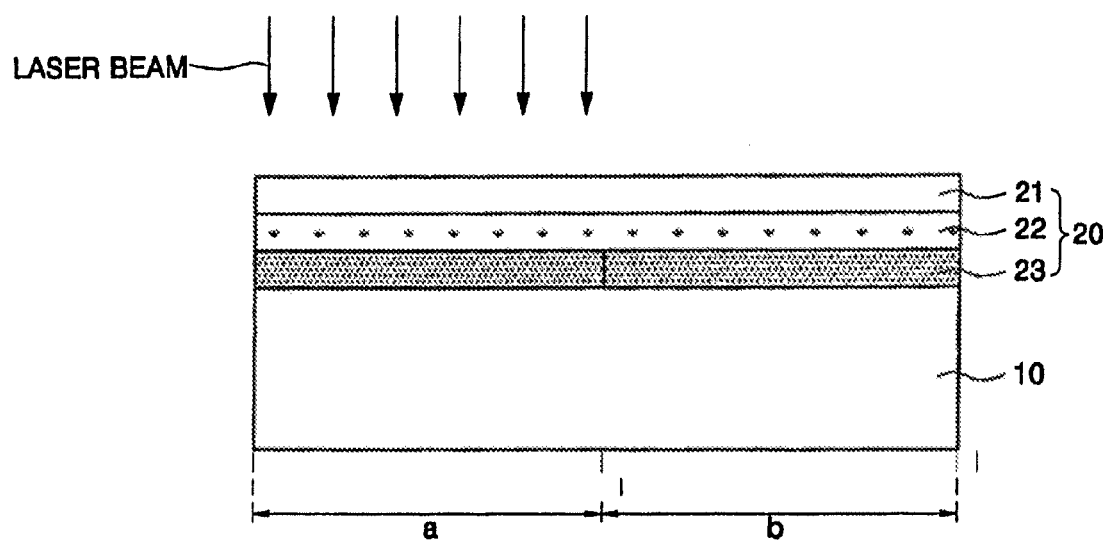
FIG. 1B is a cross-sectional view of the substrate and donor substrates of FIG. 1A, illustrating a second step in the prior art process.
Figure 1C:
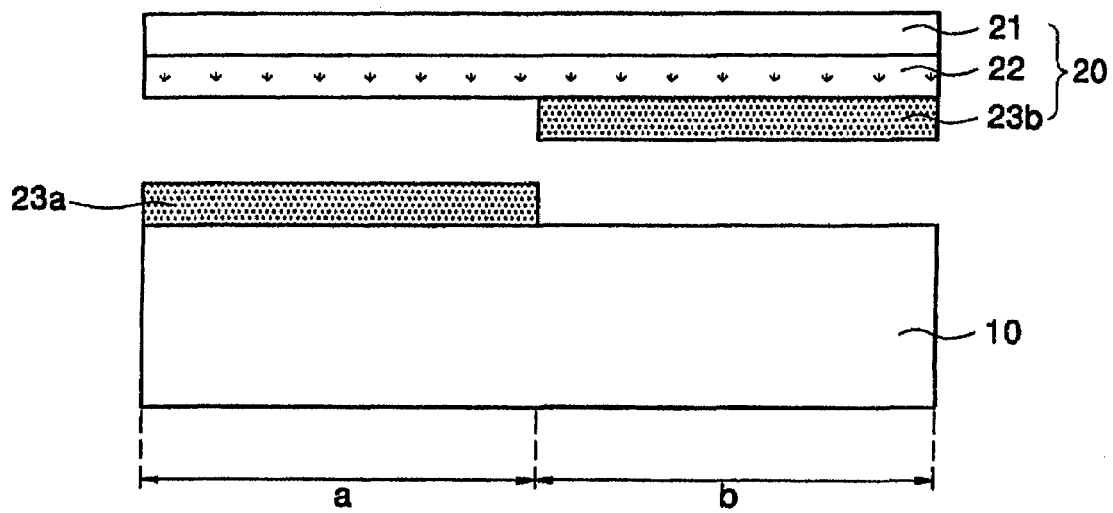
FIG. 1C is a cross-sectional view of the substrate and donor substrates of FIG. 1A, illustrating a third step in the prior art process.
Figure 2:
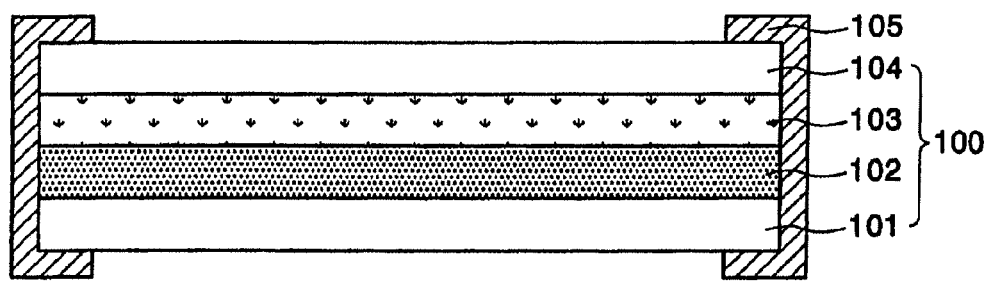
FIG. 2 is a cross-sectional view of a donor substrate according to one embodiment of the present invention.

FIG. 2 is a cross-sectional view of a donor substrate 100 according to one embodiment of the present invention. As shown in FIG. 2, the donor substrate 100 includes a base layer 101, a light-to-heat conversion (LTHC) layer 102, an anti-static layer 103, and a transfer layer 104. These layers are applied sequentially on the base layer 101. A frame 105 comprising a conductive material is attached to the periphery of the donor substrate 100.

The base layer 101 should be transparent so that light can be transmitted to the LTHC layer 102. In one embodiment, the base layer 101 is a polymer having appropriate optical properties and sufficient mechanical stability. The polymer of the base layer 101 may be selected from the group consisting of polyester, polyacryl, polyepoxy, polyethylene, polystyrene and mixtures thereof. In another embodiment, the base layer 101 is polyethylene terephthalate (PET).

The LTHC layer 102 absorbs light in the infrared (IR)-visible (V) region and converts part of the light to heat. The LTHC layer 102 should have appropriate optical density and may be a light absorbing material. The LTHC layer 102 may be a metal layer, such as Al, Ag, oxides thereof or sulfides thereof. Alternatively, the LTHC layer 102 may be a polymer organic layer, such as carbon black, black lead, or IR dyes. The metal layer may be formed by vacuum deposition, electronic beam (e-beam) deposition, or sputtering. The organic layer may be formed by any film coating method, for example, roll coating, photogravure, extrusion, spin coating, and knife coating.

The anti-static layer (interlayer) 103 serves to suppress static electricity that may occur when the donor substrate 100 is adhered to the substrate (not shown) or when the donor substrate 100 is detached from the substrate after laser induced thermal imaging (LITI). The anti-static layer 104 of the donor substrate 100 is connected to the frame 105, and the frame 105 is connected to a grounded stage, thereby suppressing generation of static electricity. The anti-static layer 103 may be an organic material, an inorganic material, or a combination thereof. The organic material may be a conductive polymer selected from the group consisting of polyaniline, polypyrrole, polythiophene, and poly(3,4-ethylenedioxythiophene). When the anti-static layer 103 is a conductive polymer, it may have a uniform thickness and be formed by wet coating. The inorganic material may be selected from the group consisting of antimony tin oxide (ATO), indium tin oxide (ITO), indium zinc oxide (IZO), $Nb_2O_3$, ZnO and TiN. When the anti-static layer 103 is an inorganic material, it is highly conductive, controls static electricity efficiently, and is durable. The combination of organic and inorganic materials may be selected from the group consisting of ATO sols, ITO sols, Ag—Pd and Ag—Ru. In this embodiment, because the combination of organic and inorganic materials is in the sol state, a thin layer can be formed and conductivity is increased.

The transfer layer 104 may be selected from the group consisting of organic emission layers, organic hole injection layers, organic hole transport layers, organic hole blocking layers, organic electron injection layers, organic electron transport layers and laminated layers thereof.

The transfer layer 104 may be formed by extrusion, spin coating, knife coating, vacuum deposition or chemical vapor deposition (CVD).

An intermediate layer may be disposed between the anti-static layer 103 and the transfer layer 104 to enhance transfer characteristics. In this embodiment, the intermediate layer may be a gas generation layer, a buffer layer, a metal reflective layer or a combination thereof.

The gas generation layer provides transfer energy by absorbing light or heat and causing a decomposition reaction, thereby emitting $N_2$ gas or $H_2$ gas. The gas generation layer may be pentaerythrite tetranitrate or trinitrotoluene.

The buffer layer prevents light-heat absorbing materials from contaminating or damaging the transfer layer 104, which is formed later. Also, the buffer layer controls adhesion of the anti-static layer 103 with the transfer layer 104, thus improving transfer pattern characteristics. The buffer layer may be a metal oxide, a non-metal inorganic compound, or an inert polymer.

The metal reflective layer reflects laser beams irradiated onto the base layer 101 of the donor substrate 100 in order to apply more energy to the LTHC layer 102. Also, when a gas generation layer is used, the metal reflective layer prevents gas generated by the gas generation layer from diffusing into the transfer layer 104.

As described above, the frame 105 that is attached to the periphery of the donor substrate 100 may comprise a conductive material. The conductive material may be an organic material, an inorganic material, or a combination thereof. For example, the organic material may be a conductive polymer selected from the group consisting of polyaniline, polypyrrole, polythiophene and poly(3,4-ethylenedioxythiophene). The inorganic material may be selected from the group consisting of ATO, ITO, IZO, $Nb_2O_3$, ZnO and TiN. When the frame 105 comprises an inorganic material, it is highly conductive, controls static electricity efficiently, and is durable. The combination of organic and inorganic materials may comprise a material selected from the group consisting of ATO sols, ITO sols, Ag—Pd and Ag—Ru.

In one embodiment, the anti-static layer 104 of the donor substrate 100 is directly connected or electrically connected to the frame 105. During LITI, the frame 105 is connected to a grounded stage, thereby controlling any static electricity that may arise.

The frame 105 keeps the donor substrate 100 flat. Thus, the substrate may adhere to the donor substrate 100 without sagging into the donor substrate 100 during LITI. As a result, transfer characteristics are improved. After the transfer layer 104 is formed by LITI, the donor substrate 100 may be easily detached from the substrate using the frame 105.

Hereinafter, a method of fabricating an organic light emitting display (OLED) by LITI using a donor substrate according to one embodiment of the present invention will be described with reference to FIGS. 3A through 3C.

Figure 3A:
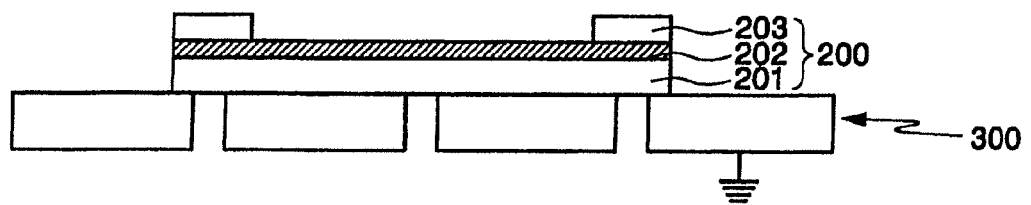
FIG. 3A is a cross-sectional view of a substrate illustrating a first step in a method of fabricating an organic light emitting display (OLED) according to one embodiment of the present invention.

Referring to FIG. 3A, a substrate suction stage 300 on which a substrate 200 is grounded is provided.

The substrate 200 includes a first electrode 202 formed on an insulating substrate 201 by any suitable method, and a pixel defining layer 203 formed on the first electrode 202 for defining a pixel region. The substrate 200 may also include a thin film transistor (TFT) and a plurality of insulating layers. When the first electrode 202 is an anode, it may be a transparent electrode comprising a metal having a high work function, such as ITO or IZO. Alternatively, the anode may be a reflective electrode comprising a material selected from the group consisting of Pt, Au, Ir, Cr, Mg, Ag, Ni, Al and alloys thereof.

When the first electrode 202 is a cathode, it may be a thin transparent electrode comprising a metal having a low work function, such as Mg, Ca, Al, Ag, Ba, and alloys thereof. Alternatively, the cathode may be a thick reflective electrode.

Figure 3B:
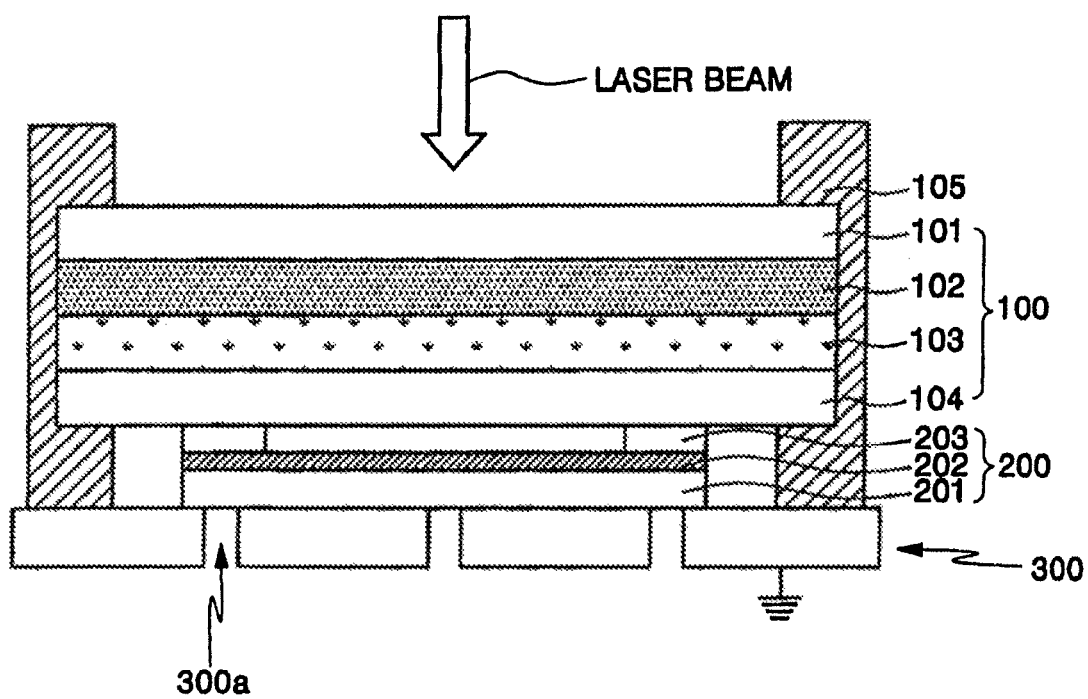
FIG. 3B is a cross-sectional view of the substrate of FIG. 3A illustrating a second step in the method of fabricating an OLED.

The substrate suction stage 300 is grounded and fixedly adsorbs and moves the substrate 200 using a suction portion 300a, shown in FIG. 3B.

In addition, a donor substrate 400, which has a periphery to which a conductive frame 405 is attached, is fabricated according to one embodiment of the present invention. The donor substrate 400 includes a base layer 401, an LTHC layer 402, an anti-static layer 403, and a transfer layer 404. The anti-static layer 403 is connected to the frame 405.

Referring to FIG. 3B, the donor substrate 400 with the frame 405 is adhered to the substrate 200, which is adsorbed and fixed to the stage 300 such that the donor substrate 400 faces a pixel region of the substrate 200. The anti-static layer 403 of the donor substrate 400 may be connected to the frame 405, and the frame 405 may be connected to the grounded stage 300.

Laser beams are then irradiated onto a predetermined region of the donor substrate 400, thus transferring the transfer layer 401 onto the pixel region of the first electrode 202.

The transfer layer 404 includes at least an organic emission layer and may further include at least one layer selected from the group consisting of hole injection layers, hole transport layers, hole blocking layers, electron transport layers, and electron injection layers to enhance the properties of the OLED.

The organic emission layer may comprise a red light emitting material, which is a small molecular material such as Alq3(host)/DCJTB(fluorescent dopant), Alq3(host)/DCM (fluorescent dopant) or CBP(host)/PtOEP(phosphorescent organic metal complex). The red light emitting material may alternatively comprise a polymer such as a PFO-based polymer or a PPV-based polymer. The organic emission layer may also comprise a green light emitting material, which is a small molecular material such as Alq3, Alq3(host)/C545t(dopant) or CBP(host)/IrPPy(phosphorescent organic metal complex). The green light emitting material may alternatively comprise a polymer such as a PFO-based polymer or a PPV-based polymer. Also, the organic emission layer may comprise a blue light emitting material, which is a small molecular material such as DPVBi, spiro-DPVBi, spiro-6P, distilled benzene (DSB) or distilled arylene (DSA). The blue light emitting material may alternatively comprise a polymer such as a PFO-based polymer or a PPV-based polymer.

When the first electrode 202 is an anode, a hole injection layer is formed on the first electrode 202. The hole injection layer comprises a material that is highly adhesive to the first electrode 202 and requires low ionization energy to inject holes, thereby increasing the lifetime of the OLED. For example, the hole injection layer may be an aryl aminic compound, a porphyrin-based metal complex, or a starburst amine. In one embodiment, the hole injection layer comprises a material selected from the group consisting of 4,4',4"-tris (3-methylphenyl-phenylamino)-triphenylamine (m-MT-DATA), 1,3,5-tris[4-(3-methyl-phenyl-phenyl-amino)phenyl]benzene(m-MTDATB), and phthalocyanine copper (CuPc).

The hole transport layer enables easy transport of holes to the emission layer and prevents electrons generated by a second electrode (not shown) from moving to an emission region, thereby increasing the luminous efficiency of the OLED. The hole transport layer may comprise an arylene diamine derivative, a starburst compound, a biphenyl diamine derivative with a spiro radical, or a trapezoidal compound. For example, the hole transport layer may comprise N,N-diphenyl-N,N'-bis(4-methyl-phenyl)-1,1'-biphenyl-4,4'-diamine(TPD) or 4,4'-bis[N-(1-naphthyl)-N-phenyl-amino]biphenyl(NPB).

The hole blocking layer prevents deterioration of luminous efficiency, which may deteriorate when hole mobility is higher than electron mobility in the organic emission layer and when excitons formed in the emission layer are distributed over a wide range. The hole blocking layer may comprise a material selected from the group consisting of 2-biphenyl-4-yl-5-(4-t-butylphenyl)-1,3,4-oxydiazol(PBD), spiro-PBD and 3-(4'-tert-butylphenyl)-4-phenyl-5-(4'-biphenyl)-1,2,4-triazol(TAZ).

The electron transport layer may be positioned on the organic emission layer and formed of an electron-receptive metal compound. For example, the electron transport layer may comprise 8-(hydroquinoline) aluminum (Alq3), which stably receives electrons transported from the second electrode.

The organic layer may be formed by spin coating or deposition. Alternatively, one of the organic emission layer and organic layer may be formed simultaneously with the formation of the transfer layer 404 on the donor substrate 400.

Figure 3C:
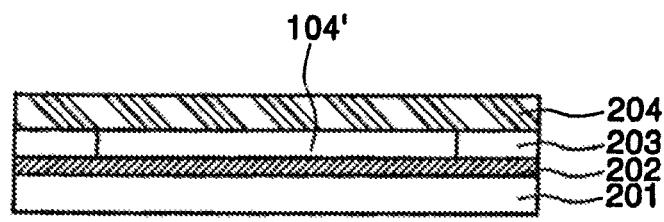
FIG. 3C is a cross-sectional view of the substrate of FIG. 3A illustrating a third step in the method of fabricating an OLED.

Referring to FIG. 3C, after the transfer layer 404 is transferred onto the first electrode 202, the donor substrate 400 is detached from the substrate 200, thus forming an organic layer pattern 404'. Thereafter, a second electrode 204 is formed on the organic layer pattern 404'. Although not shown in the drawings, the resultant structure is encapsulated using an encapsulation substrate or a metal can, thereby completing the OLED.

When the second electrode 204 is a cathode, it may be a thin transparent electrode formed of a metal having a low work function selected from the group consisting of Mg, Ca, Al, Ag and alloys thereof. Alternatively, the cathode may be a thick reflective electrode.

When the second electrode 204 is an anode, it may be a transparent electrode formed of a metal having a high work function, such as ITO or IZO. Alternatively, the anode may be a reflective electrode formed of a material selected from the group consisting of Pt, Au, Ir, Cr, Mg, Ag, Ni, Al and alloys thereof.

As described above, the embodiments of the present invention effectively control static electricity that may arise during fabrication of an OLED by LITI. Therefore, deterioration of the OLED due to the static electricity is prevented, and a high-quality OLED is realized.

Further, the donor substrates of the present invention include frames on their peripheries, enabling effective formation of transfer layers by LITI. The donor substrates are also easily attached to and detached from substrates, thereby increasing productivity.

Although the present invention has been described with reference to certain exemplary embodiments thereof, it is understood by those skilled in the art that various modifications and variations may be made to the described embodiments without departing from the spirit and scope of the present invention as defined in the appended claims.

What is claimed is:

1. A donor substrate for laser induced thermal imaging comprising:
    a base layer;
    a light-to-heat conversion layer on the base layer;
    an anti-static layer on the light-to-heat conversion layer;
    a transfer layer on the anti-static layer; and
    a conductive frame connected to the anti-static layer and framing a periphery of the donor substrate.

2. The donor substrate according to claim 1, wherein the conductive frame comprises a material selected from the group consisting of organic materials, inorganic materials and combinations thereof.

3. The donor substrate according to claim 2, wherein the organic material is selected from the group consisting of polyaniline, polypyrrole, polythiophene and poly(3,4-ethylenedioxythiophene).

4. The donor substrate according to claim 2, wherein the inorganic material is selected from the group consisting of antimony tin oxide (ATO), indium tin oxide (ITO), indium zinc oxide (IZO), $Nb_2O_3$, ZnO and TiN.

5. The donor substrate according to claim 2, wherein the conductive frame comprises a material selected from the group consisting of ATO sols, ITO sols, Ag—Pd and Ag—Ru.

6. The donor substrate according to claim 1, wherein the anti-static layer comprises a conductive material.

7. The donor substrate according to claim 6, wherein the conductive material is selected from the group consisting of polyaniline, polypyrrole, polythiophene, poly(3,4-ethylenedioxythiophene), ATO, ITO, IZO, $Nb_2O_3$, ZnO, TiN, ATO sols, ITO sols, Ag—Pd and Ag—Ru.

8. The donor substrate according to claim 1, wherein the light-to-heat conversion layer comprises a material selected from the group consisting of organic layers, metal, metal oxides, metal sulfides and metal alloys.

9. The donor substrate according to claim 1, wherein the base layer comprises a material selected from the group consisting of glass substrates and transparent polymers, wherein the transparent polymer is selected from the group consisting of polyester, polyacryl, polyepoxy, polyethylene and polystyrene.

10. The donor substrate according to claim 1, further comprising an intermediate layer between the anti-static layer and the transfer layer.

11. The donor substrate according to claim 10, wherein the intermediate layer comprises a layer selected from the group consisting of gas generation layers, buffer layers, thin metal layers and combinations thereof.

12. The donor substrate according to claim 1, wherein the transfer layer comprises a layer selected from the group consisting of organic emission layers, organic hole injection layers, organic hole transport layers, organic hole blocking layers, organic electron injection layers, organic electron transport layers and laminated layers thereof.

13. A method of fabricating a donor substrate for laser induced thermal imaging, comprising:
    providing a base layer;
    forming a light-to-heat conversion layer on the base layer;
    forming an anti-static layer on the light-to-heat conversion layer;
    forming a transfer layer on the anti-static layer; and
    forming a conductive frame on the periphery of the donor substrate,
    wherein the anti-static layer is connected to the conductive frame.

14. The method according to claim 13, wherein the transfer layer is formed by a process selected from the group consisting of deposition processes and wet processes.

15. The method according to claim 13,
    wherein when the light-to-heat conversion layer is a metal layer, the light-to-heat conversion layer is formed by a method selected from the group consisting of vacuum deposition, electron-beam deposition and sputtering, and
    wherein when the light-to-heat conversion layer is an organic layer, the light-to-heat conversion layer is formed by a method selected from the group consisting of roll coating, photogravure, extrusion, spin coating and knife coating.

16. The method according to claim 13, further comprising forming an intermediate layer between the anti-static layer and the transfer layer,
    wherein the intermediate layer comprises a layer selected from the group consisting of gas generation layers, buffer layers, thin metal layers and combinations thereof.

17. The method according to claim 13, wherein the transfer layer is formed by a process selected from the group consisting of extrusion, spin coating, knife coating, vacuum deposition, and chemical vapor deposition (CVD).

18. A method of fabricating an organic light emitting display, comprising:
    patterning a first electrode on a substrate;
    fixedly adsorbing the substrate to a stage that is transferable and grounded;

disposing the donor substrate of claim 1 opposite a pixel region of the substrate;

transferring an organic layer including at least an emission layer to the donor substrate by selectively irradiating laser beams on the donor substrate;

detaching the donor substrate from the substrate; and forming a second electrode on the substrate.

19. The method according to claim 18, wherein the first electrode is selected from the group consisting of anodes and cathodes.

20. The method according to claim 18, wherein the frame of the donor substrate is connected to the grounded stage.

21. The method according to claim 18, wherein the organic layer further comprises a layer selected from the group consisting of organic hole injection layers, organic hole transport layers, organic hole blocking layers, organic electron injection layers, organic electron transport layers and combinations thereof.

* * * * *

UNITED STATES PATENT AND TRADEMARK OFFICE
CERTIFICATE OF CORRECTION

| | |
|---|---|
| PATENT NO. | : 7,572,568 B2 |
| APPLICATION NO. | : 11/874163 |
| DATED | : August 11, 2009 |
| INVENTOR(S) | : Mu-Hyun Kim et al. |

It is certified that error appears in the above-identified patent and that said Letters Patent is hereby corrected as shown below:

On the Title Page

Item (73) Assignee    Delete "Samsung SDI Co., Ltd."
                      Insert -- Samsung Mobile Display Co., Ltd. --

Signed and Sealed this
Twenty-sixth Day of April, 2011

David J. Kappos
*Director of the United States Patent and Trademark Office*